United States Patent [19]

Westbrook et al.

[11] Patent Number: 4,964,134
[45] Date of Patent: Oct. 16, 1990

[54] SEMICONDUCTOR LASER STRUCTURES

[75] Inventors: Leslie D. Westbrook, Ipswich; Michael J. Adams, Suffolk, both of England

[73] Assignee: British Telecommunications public limited company, Great Britain

[21] Appl. No.: 254,934
[22] PCT Filed: Feb. 18, 1988
[86] PCT No.: PCT/GB88/00101
§ 371 Date: Oct. 4, 1988
§ 102(e) Date: Oct. 4, 1988
[87] PCT Pub. No.: WO88/06360
PCT Pub. Date: Aug. 25, 1988

[30] Foreign Application Priority Data

Feb. 18, 1987 [GB] United Kingdom ............... 8703743

[51] Int. Cl.$^5$ ............................................. H01S 3/19
[52] U.S. Cl. ...................................... 372/45; 372/96
[58] Field of Search ....................... 372/44, 45, 46, 96

[56] References Cited

U.S. PATENT DOCUMENTS

4,257,011  3/1981  Nakamara et al. ................... 372/96

OTHER PUBLICATIONS

Electronics Letters, vol. 21, No. 13, 20 Jun. 1985, (Stevenage, Hertz, GB), N. K. Dutta et al.: "Fabrication and Performance Characteristics of InGaAsP Ridge—Guide Distributed–Feedback Multi–Quantum–Well Lasers", pp. 571–573.
IEEE Journal of Quantum Electronics, vol. QE-21, No. 10, Oct. 1985, (IEEE, New York, US), Y. Arakawa et al.: "Theory of Gain, Modulation Reseponse, and Spectral Linewidth in AlGaAs Quantum Well Lasers", pp. 1666–1674.
Electronics Letters, vol. 20, No. 1, 5 Jan. 1984, (London, GB) M. G. Burt: "Linewidth Enhancement Factor for Quantum–Well Lasers", pp. 27–29.
Electronics Letters, vol. 19, No. 6, 17 Mar. 1983, (Hitchin, Herts, GB), M. G. Burt: "Gain Spectra of Quantum–Well Lasers", pp. 210–211.
Electronics Letters, vol. 19, No. 22, 27 Oct. 1983, (Hitchin, Herts, GB), I. D. Henning et al.: "Measurements of the Semiconductor Laser Linewidth Broadening Factor", pp. 927–929.
Japanese Journal of Applied Physics, vol. 24, No. 7, part 2, Jul. 1985, (Tokyo, JP), N. Ogasawara et al.: "Linewidth Enhancement Factor in GaAS/AlGaAs Multi–Quantum–Well Lasers", pp, L519–L521.
Applied Physics Letters, vol. 42, No. 8, 15 Apr. 1983, American Institute of Physics, (New York US), K. Vahala et al.: "On the Linewidth Enhancement Factor $\alpha$ in Semiconductor Injection Lasers", pp. 631–633.
Green, C. A., Dutta, N. K.; Watson. W., Applied Physics Letters, vol. 50, No. 20, pp. 1409–1410, 1987.
Uomi, K.; Ohtoshi, T.; and Chinone N., Japan Journal Applied Physics, 24 L539, 1985.
Arakawa, Y,; Vahala, K.; Yariv, A., Applied Physics Letter vol. 45, p. 950, 1984.
Arakawa, Y.; Yariv, A., IEEE J. Quantum Electronics, QE-22, p. 1887, 1986.
Henry, C. H.; IEEE J. Quantum Electronics, QE-18(2), Feb. 1982, pp. 259–264.
Asada, M.; Kaneyama, A.; Suematsu, Y;–IEEE J. Quantum Electronics, QE-20, Jul. 1984.
Uomi, K.; Ohtoshi, T.; and Chinone, N.; "Ultra High Relaxation Oscillation Frequency ($-50$ GHz) in Modulation Doped Multiquantum Well (MD-MQW) Lasers: Theoretical Analysis", Central Research Laboratory, Hitachi, Ltd., Kokubunji, Tokyo, 185, pp. 184–185.

*Primary Examiner*—James W. Davie
*Attorney, Agent, or Firm*—Nixon & Vanderhye

[57] ABSTRACT

A laser structure with highly p-doped active material which has a particularly low linewidth enhancement factor $\alpha$. Hence the emission linewidth of the laser structure is relatively small. The structure shows a particular relationship between the photon energy, the band gap energy and the conduction band quasi Fermi level of the active material which minimizes $\alpha$, the valence band being degenerate. These conditions can be used to design low $\alpha$ laser structures. Such structures are of particular application to directly modulated lasers or absorption modulators and also find application in coherent optical detection.

11 Claims, 6 Drawing Sheets

Fig. 1.b

SEMICONDUCTOR LASER STRUCTURES

BACKGROUND OF THE INVENTION

1. Field of the Invention

The present invention relates to semiconductor laser structures and finds application in optical communications.

2. Description of Related Art

The radiation used in optical communications is not necessarily strictly in the visible region. If silica optical fibres are used as the transmission medium, infra-red radiation is of special usefulness since the loss minima occur in such fibres at 1.3 μm and 1.55 μm approximately. (The above wavelengths are in vacuo wavelengths as are all wavelengths herein except where otherwise specifically stated).

Semiconductor lasers are known which will emit optical radiation at wavelengths including the above. In general a semiconductor laser structure will include a p-n junction across which a driving current can be applied (the conventional current from p to n), an "active region" in which electrons and holes combine, producing photons by stimulated emission, and a feedback structure to cause oscillation of radiation in the active region. The active region has to relate suitably in band gap and refractive index to the other semiconductor regions of the structure in order to achieve a suitable degree of "confinement" of these processes to the active region. Lasers operating to produce optical radiation in the wavelength range from 1.1 to 1.65 μm, especially from 1.3 to 1.6 μm, usually comprise regions of indium phosphide and of the quaternary material ($In_xGa_{1-x}As_yP_{1-y}$). By suitable choices of x and y it is possible to lattice-match the various regions while varying the band gaps of the materials. (Band gaps can be determined experimentally by for instance photoluminescence). Additionally, both indium phosphide and the quaternary materials can be doped to p- or n- type as desired.

Semiconductor lasers comprising regions of gallium arsenide and gallium aluminium arsenide are also used for communications purposes. They operate near to 0.9 μm.

The feedback structure might comprise for instance reflective end facets of the laser (Fabry-Perot or FP lasers). Alternatively it might comprise a grating of corrugations which lie near the active region (distributed feedback or DFB lasers). The corrugations may be shifted to a position external to the laser structure, adjacent the emission axis (a distributed Bragg reflector or DBR laser), or a reflective interface may be used in a cavity external to the laser.

Semiconductor lasers may vary otherwise in structure. For instance a double heterostructure (DH) laser may comprise an (initially undoped) active region of a first material, lying between a lower n-doped layer and an upper p-doped layer each of a different material. In a multiple quantum well (QW) laser, the active region comprises one or more very thin layers of active material, and where a plurality of such layers are provided, they are separated by barrier layers. The thin active layers are each so thin that that dimension is comparable to the De Broglie wavelength for electrons, and the discreteness of the density distribution of energy states in the active material becomes apparent. Quantum well layers have thicknesses (known as well width) typically of the order of 10 nm and the barrier layers may be still thinner.

Semiconductor laser structures are used in devices other than optical sources. For instance, if the driving current applied is less than a lasing threshold driving current, a laser structure may still be useful as an optical amplifier, amplifying an optical radiation input signal. Further, a laser structure may be used as an absorption modulator, a device coupled to a laser output port which can be switched between optically opaque and transparent conditions with respect to the laser output and so modulate it.

Laser structures vary considerably from each other in a number of operating characteristics. A known characteristic, which affects the modulation performance of directly modulated lasers, as well as laser emission linewidth, is the linewidth enhancement factor "α".

In directly modulated lasers, transient wavelength chirping is a phenomenon which occurs for instance either when a laser is switched on and off to produce a directly modulated output signal, or when an absorption modulator is used. It has the effect of distorting the oscillation frequency of an optical pulse, the pulse then tending to spread during transmission in a dispersive medium and causing difficulty in detection.

In some applications, particularly coherent optical communications, it is important that the continuous wave emitted radiation shows a narrow linewidth. This allows coherent detection systems, such as heterodyne or homodyne detection, to be used which are more sensitive than direct detection and give better bandwidth discrimination.

Unmodified FP lasers have been found unsuitable, having linewidths of more than 100 MHz. It is known that DBR and DFB lasers can be fabricated having narrower emission linewidths and that external structures such as external cavities can result in narrowed emission linewidths. However, both emission linewidth and transient wavelength chirping have tended to remain unpredictable characteristics in the design of laser structures.

Considerable work has been done in trying to assess linewidth in a laser structure. In the paper "Theory of the Linewidth of Semiconductor Lasers" by Charles H Henry, IEEE Journal of Quantum Electronics, OE-18(2), February 1982 pp 259-264, a theory is presented which arrives at a linewidth broadening term $(1+\alpha^2)$. Theoretical models for the gain and for α, assuming homogeneous broadening, have been published for instance in papers by Y Arakawa and A Yariv, references IEEE J Quantum Electronics OE—21 starting on page 1666, 1985, and OE—22 starting on page 1887, 1986. Good agreement has been demonstrated with experimental data in GaAs quantum wells. However, the models have necessitated a large degree of numerical computation and the design of optimal structures has been complicated as a result.

In the paper "Dispersion of the Linewidth Enhancement Factor in Semiconductor Injection Lasers", by N. OGASAWARA et al, Japanese Journal of Applied Physics 23 1984 pp L518 to L520, it is predicted that the value of α decreases with increasing excitation frequency. However the relationship is complicated and difficult to apply to the design of laser structures for particular purposes. In addition, there is a practical problem in working at the high excitation frequencies, in that absorption also increases and the laser structure loses its transparency.

SUMMARY OF THE INVENTION

It has now been found that by a relatively simple modification of a laser structure, it is possible to recognise and exploit a much simpler relationship between $\alpha$ and excitation frequency without unacceptable increases in absorption.

It is an object of the present invention to provide a practical laser structure with a relatively low linewidth enhancement factor "$\alpha$".

According to the present invention there is provided a direct band gap semiconductor laser structure whose emission wavelength is less than its active material band-gap equivalent wavelength by an amount such that the emitted photon energy is equal or approximately equal to the sum of the band gap energy and the conduction band quasi Fermi level measured from the conduction band edge, the active material of the laser structure being doped p-type to a level at which the laser structure shows positive gain under working conditions.

That is to say, the present invention comprises a direct band gap semi-conductor laser structure having means for determining its emission wavelength, wherein the following relationships are satisfied:

$$E \text{ is equal or approximately equal to } Eg + \frac{Mc}{Mr} Efc \quad \text{(i)}$$

$$-Efv > \frac{Mc}{Mv} Efc \quad \text{(ii)}$$

where
 E is the emitted photon energy
 Eg is the band gap energy
 Mc is the conduction band electron effective mass
 Mv is the valence band hole effective mass
 Mr is the reduced mass given by $1/Mr = 1/Mc + 1/Mv$
 Efc is the conduction band quasi Fermi level measured from the conduction band edge, and
 Efv is the valence band quasi Fermi level measured from the valence band edge,
the material-dependent parameters of the above relating to the active material of the laser structure.

The dopant used in doping the active material of the laser structure p-type should not be a dopant which reduces the radiative efficiency of the material to a degree rendering it unacceptable opaque under the woking conditions, particularly the emission wavelength selected, of the laser structure. For instance, Zn although a widely used p-type dopant is unlikely to be suitable but Be (berillium) is likely to be suitable.

Preferably the value of (E-Eg) should be as close as possible to the value of (Mc/Mr) Efc. However, it may not be convenient to estimate the relevant parameters perfectly accurately. For instance using a technique for estimating Efc described below, there may be an error of up to 10°/o in Efc. However, it should be possible to achieve values of $\alpha$ of the order of 2, 1, or even 0.5 or less, for laser structures according to embodiments of the present invention.

The values of Mc, Mr and Mv have been measured for a wide variety of semiconductor materials and their values published. They can for instance be determined by reference to the book "Physics of Semiconductor Devices" by S M Sze, published by Wiley Interscience.

Eg in the case of a bulk semiconductor laser structure, that is a laser structure which does not include a quantum well active layer, has also been measured and published for a wide variety of semiconductor materials. In the case of a quantum well laser structure, Eg is the effective band gap energy between the lowermost energy state of the conduction band and the highest energy of the valence band, and can be assessed in terms of the well width, for instance in accordance with the relationship quoted by M Asada, A Kaneyama and Y Suematsu in the IEEE Journal of Quantum Electronics, OE20, July 1984.

Efc in a bulk semiconductor laser structure can be taken to be $$= kT(\log(N/Nc) + 0.35(N/Nc))$$

where
 N is the injected carrier density (which can be determined from the carrier lifetime in the material concerned, and the driving current used)
 Nc is the conduction band effective density of states (published and determinable as for Mc, Mr and Mv above)
 k is Boltzmann's constant
 T is the absolute temperature,
Efc in a QW laser structure can be taken to be $$= kT \log(\exp(\pi\hbar^2 NL_z/kTMc) - 1)$$

where
 $\hbar$ is Dirac's constant
 $L_z$ is the well width,
Efv in a bulk semiconductor laser structure can be taken to be $$= -kT(\log(P/Nv) + 0.35(P/Nv))$$

where
 P is the hole density of the active layer material and equals the sum of the injected carrier density N and the level of p-doping Na (in a p-doped material), and
 Nv is the valence band effective density of states in the active layer material (published and determinable as for Mc, Mr and Mv above)
Efv in a QW laser structure can be taken to be $$= -kT \log(\exp(\pi\hbar^2 PL_z/kTMv) - 1).$$

Condition (ii) above, the condition for positive gain under working conditions, is roughly equivalent to the density of holes being such that Efv is at least degenerate with respect to the valence band edge, since Mc/Mv is small for at least most known direct band gap semiconductor materials. In order that Efv should be so degenerate in a bulk semiconductor laser structure, that is a laser structure which does not include a quantum well active layer, then according to W B Joyce and R W Dixon in Applied Physics Letters 31 1977, starting on page 354, the following relationship applies:

$$\log_e\left(\frac{P}{Nv}\right) > -0.35\left(\frac{P}{Nv}\right)$$

The above relationship is satisfied when P equals at least 0.77 Nv. A typical value of Nv for a semiconductor laser material is $1.2 \times 10^{19}$ cm$^{-3}$. To keep injected carrier densities relatively low, for instance of the order of $1 \times 10^{18}$ cm$^{-3}$, in order to keep the lasing threshold current of the structure low, the material of the active layer would then have to be doped p-type to a level Na at least of the order of $8 \times 10^{18}$ cm$^{-3}$, for instance $7.8 \times 10^{18}$ cm$^{-3}$ or above.

The use of a bulk semiconductor laser structure can have an advantage in optical communications in that materials used to produce the active layer will emit radiation at the wavelength 1.55 μm particularly easily. This is advantageous as mentioned above, for use with silica optical fibres.

In a QW laser structure, the valence band is degenerate when $$P > \frac{M v k T \log 2}{\pi \hbar^2 L_z}$$

Typically, $$\frac{M_v k T \log 2}{\pi \hbar^2}$$

equals about $4.7 \times 10^{16}$ m$^{-2}$.

Therefore, where $L_z = 10$ nm, P must be of the order of at least $4.7 \times 10^{18}$ cm$^{-3}$. That is, half the hole density necessary for a bulk semiconductor laser structure. Hence in a QW laser structure, the material of the active layer would only have to be doped p-type to a level Na at least of the order of $4 \times 10^{18}$ cm$^{-3}$, for instance $3.8 \times 10^{18}$ cm$^{-3}$ or above.

BRIEF DESCRIPTION OF THE DRAWING

A planar laser structure according to an embodiment of the present invention will now be described, by way of example only, with reference to the accompanying Figures in which:

FIGS. 1a and 1b show a cross section of the laser structure;

DESCRIPTION OF THE PREFERRED EMBODIMENT(S)

Figure 1A:
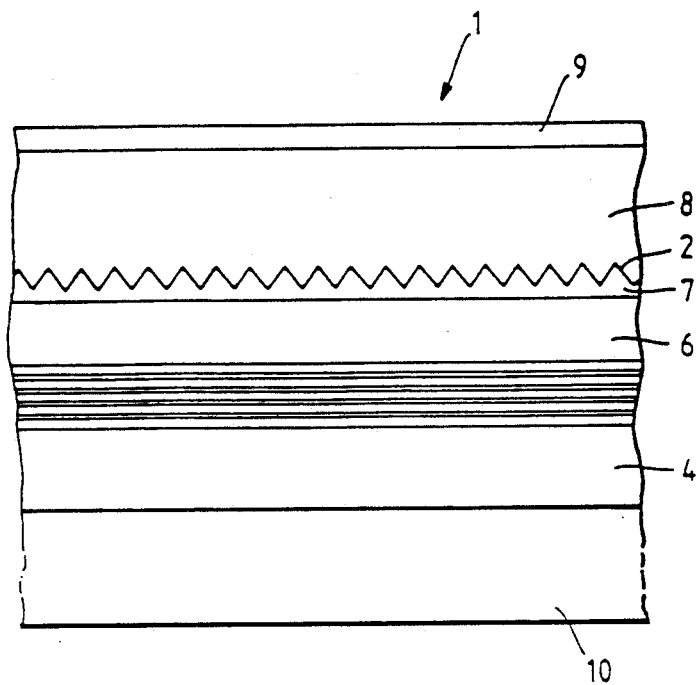
Figure 1A:
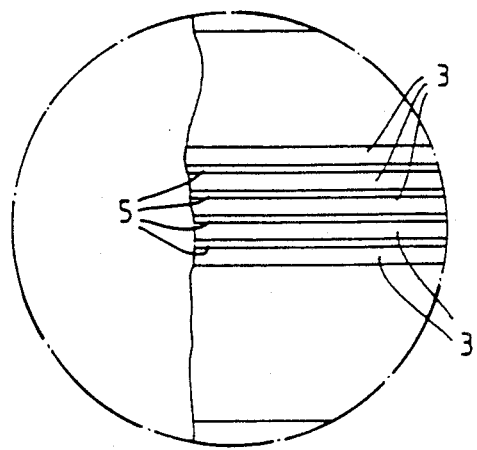

Referring to FIG. 1, the laser structure 1 is a DFB laser structure having an internal grating 2. Parallel to the plane of the grating 2 extend five quantum well active layers 3. Overall, the structure is planar, comprising fourteen different layers 3 to 9 grown epitaxially onto a substrate 10.

(Although words implying a specific orientation of a structure, such as "top" or "above" may be used in this specification, they are used for convenience of description only and should not be taken to indicate that such an orientation is a necessary characteristic unless it is specifically stated.)

In more detail, the laser structure 1 comprises the following:

(i) a substrate 10 of InP, approximately 100 μm thick, with a surface corresponding to the (100) crystal plane. It is doped n-type with Sn to a level in the range from 1 to $6, \times 10^{18}$ cm$^{-3}$.

(ii) a cladding/buffer layer 4 of InP, 1.0 μm thick, doped n-type with Sn to a level in the range from 1 to $6, \times 10^{18}$ cm$^{-3}$;

(iii) a multiple quantum well layer stack comprising five active layers 3 of $In_{0.53}Ga_{0.47}As$, each 10 nm thick, separated by four barriers 5 of InP, each 5 nm thick. Each layer 3 and barrier 5 of the stack is doped p-type with Be to a level of $4.3 \times 10^{18}$ cm$^{-3}$.

(iv) a cladding layer 6 of InP, 0.1 μm thick, doped p-type with Be to a level in the range 1 to $5, \times 10^{18}$ cm$^{-3}$;

(v) a waveguiding layer 7 of $In_{0.78}Ga_{0.22}As_{0.51}P_{0.49}$, 0.2 μm thick, doped p-type with Be to a level in the range 1 to $5, \times 10^{-18}$ cm$^{-3}$;

(vi) a cladding layer 8 of InP, 1.0 μm thick, doped p-type with Be to a level in the range 1 to $5, \times 10^{18}$ cm$^{-3}$; and (vii) contact layer 9 of $In_{0.53}Ga_{0.47}As$, 0.1 μm thick, doped p-type with Be to a level greater than $10^{19}$ cm$^{-3}$.

The exposed face of the substrate 10 is metallised with a Sn/Au alloy in the proportions 2:98 and the exposed face of the contact layer 9 is metallised with a Ti/Au bilayer, these metallisations being known, for the purpose of supplying a driving current to the laser structure 1.

The grating 2 comprises corrugations which extend in the (110) crystal direction on the uppermost surface of the waveguiding layer 7. The period of the corrugations is 0.44 μm, and they comprise triangular cross section grooves, approximately 0.15 μm deep. (The exact period required is not easy to determine. It can be selected however in a known manner by first estimating it from the required wavelength to be fed back to the active region of the laser structure 1, and the relationship that the period=an integral number times π/β where β is the propagation constant of guided modes in the laser structure. By measuring luminescence from a slice having corrugations of the estimated period, the actual emission wavelength at that period is measured, from which by iteration the exact period required can be determined.)

All the layers of the laser structure can be grown by known molecular beam epitaxial (MBE) techniques. The grating can be produced by chemical etching through an electron-beam-exposed mask in the manner described by Westbrook et al, Electronics Letters 1982 18 pages 863 to 865.

Berillium is used to dope the active layers 3 because it shows a relatively low degree of non-radiative recombination in use. Because of the high doping level Na, such recombination can be relatively significant with certain other dopants, such as zinc.

The thickness of the active layers 3, 10 nm, is selected to achieve a particular effective bandgap equivalent wavelength of 1.55 μm, and hence a particular value of Eg, for instance in accordance with the relationship quoted by M Asada, A Kameyama and Y Suematsu in the IEEE Journal of Quantum Electronics, OE 20, July 1984.

The laser structure 1 will start to emit radiation of wavelength 1.44 μm, determined in accordance with the Bragg condition for reflection by the period of the grating 2, when a driving current at least equal to the lasing threshold current is applied. The photon energy E then fulfils the condition $$E = Eg + \frac{Mc}{Mr} Efc$$

giving α=substantially 0, since
E=0.86 eV
Eg=0.8 eV (from Asada et al)
$Mc=0.041\times 9.1\times 10^{-31}$
$Mr=7cMv/(Mc+Mv)=0.039\times 9.1\times 10^{-31}$
Efc=0.056 eV, Further, −Efv is greater than McEfc/Mv. This can be derived from the relationship Efv is approximately equal to $-kT\log_e(\exp\pi\hbar^2 PLz/kTMv - 1)$ for a quantum well laser in which $$P = N + Na = 1 \times 10^{18} \text{ (for a reasonable driving current)} + 4.3 \times 10^{18}$$
$$= 5.3 \times 10^{18} \text{ cm}^{-3} = 5.3 \times 10^{24} \text{ m}^{-3}$$

$$Lz = 10^{-8} \text{ m, and}$$

$$Mv = 0.55 \times 9.1 \times 10^{-31}$$

Putting these figures in gives −Efv=9.5 meV. But $McEfc/Mv=0.041\times 0.056/0.55$ eV=4.2 meV. Hence the laser structure 1 shows positive gain.

The multiple quantum well laser structure described above could be incorporated into any of a number of forms of lateral confinement laser structures, such as ridge waveguide or buried heterostructure.

Figure 2:
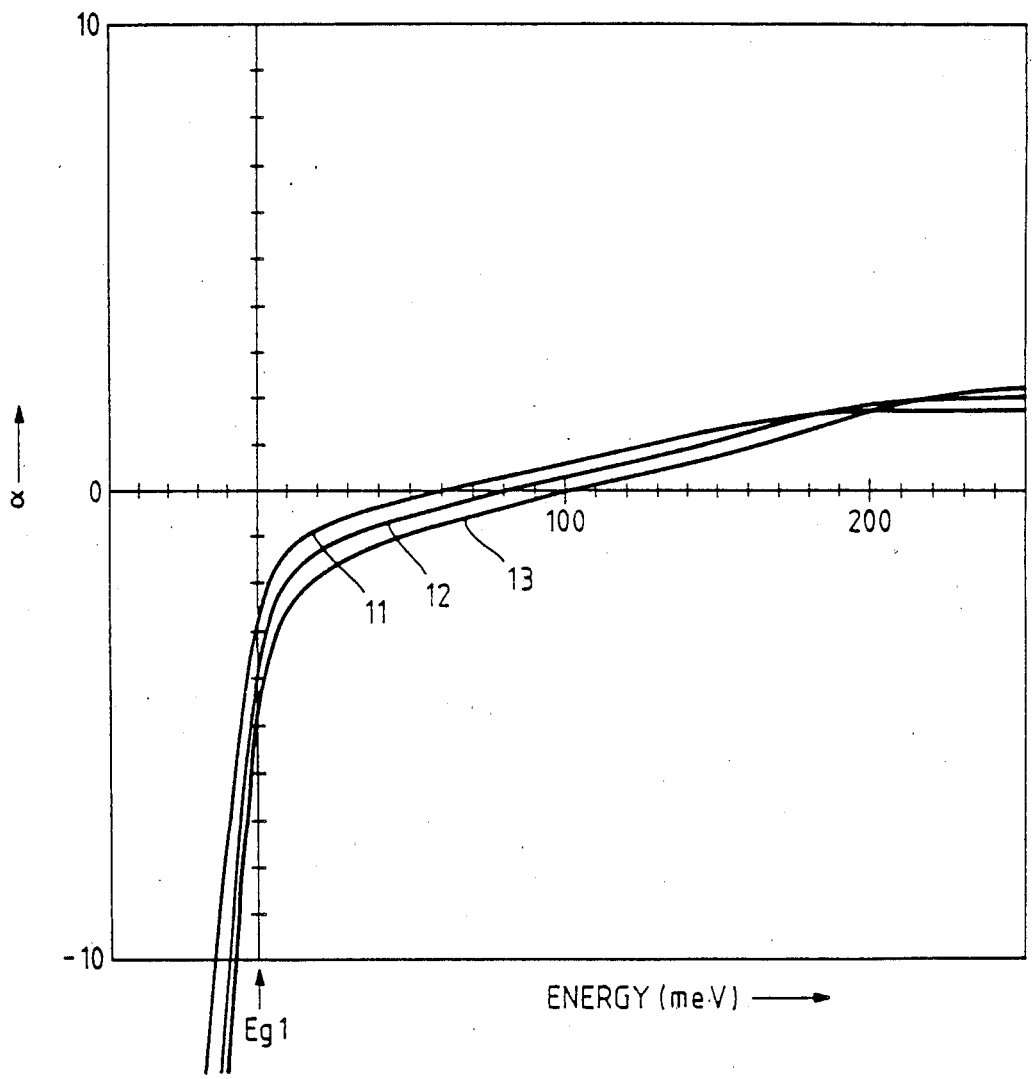
FIG. 2 shows a graph of the linewidth enhancement factor α plotted as a function of photon energy, for three different QW laser structures with undoped active material.

Referring to FIG. 2, the condition given above that $$E = Eg + \frac{Mc}{Mr} Efc$$

stems from the variation of α as a function of E. α has been found to have a value of substantially zero where that condition is fulfilled. Shown in the figure are three curves 11, 12, 13 representing α as a function of E plotted for values of Lz of 5 nm, 7.5 nm, and 10 nm respectively, for a zero value of Na. In each case, the curve crosses the zero axis for α at a value of E which lies above the band gap energy Eg by an amount substantially equal to the relevant Efc.

Figure 3:
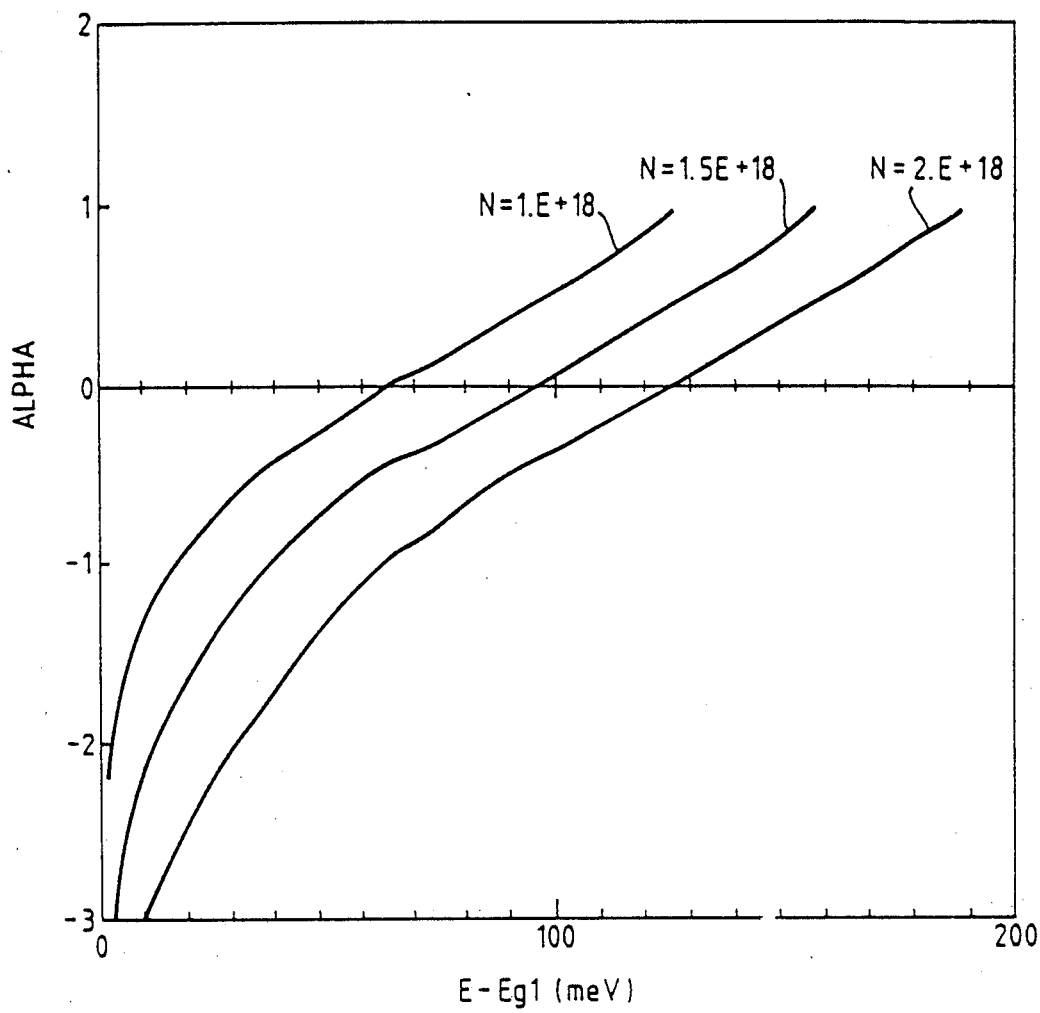
FIG. 3 shows a graph of α plotted as a function of photon energy at three different injected carrier densities for the active material of the laser structure of FIG. 1.

Alternatively, referring to FIG. 3, it is possible to plot α for the laser structure 1 described above at three different driving currents, that is, at the three different values of N 1.0, 1.5 and 2.0, $\times 10^{18}$ cm$^{-3}$.

Figure 4:
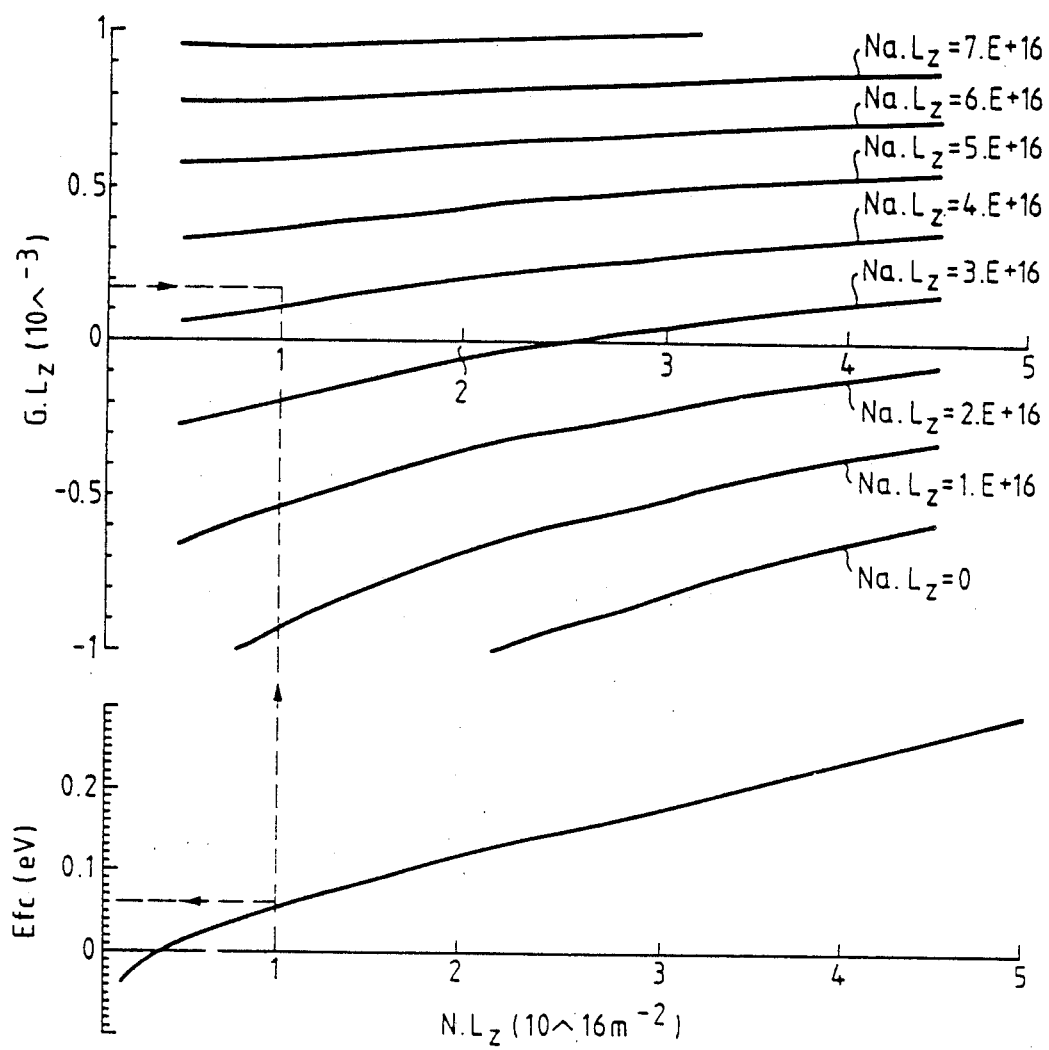
FIG. 4 shows the relationship between gain, the injected carrier density N, the p-doping level Na, and the conduction band quasi Fermi level Efc for the laser structure of FIG. 1.

Referring to FIG. 4, it is possible to plot the gain g of a quantum well laser structure against N for a range of values of Na, normalised to Lz. If Efc is also plotted against NLz, from the relationship $$Efc=\log(\exp\pi\hbar^2 NLz/kTMc - 1)$$

it is then possible to select a value of Na to achieve a particular level of gain while retaining narrow emission linewidth. For instance, if Lz=10 nm as in the structure described above for an emission wavelength of 1.44 μm, then from the values for N and Lz given above, which give $NLz=1\times 10^{16} m^2$, Efc can be seen from the Figure to equal about 60 meV. For lasing to occur, the gain g of a laser structure must substantially equal the losses. This gives an additional condition that $$g \simeq \frac{x_m L}{CL} + \text{scattering and free carrier losses}$$

where
C is the optical confinement factor,
L is the device length
$x_m$ is the "mirror" loss of the structure, determined by facet reflectivity in a Fabry-Perot laser and by grating strength in a DFB laser.

Typically C is approximately 0.1, L is 200 μm, $x_m L$ is approximately 0.3, and scattering plus free carrier losses equal about 15 cm$^{-1}$. Hence typically g must equal about 165 cm$^{-1}$. Looking at FIG. 4, this level of gain is achievable only for values of Na Lz of at least $4\times 10^{16}$ m$^{-2}$, that is for values of Na of about $4.3\times 10^{18}$ cm$^{-3}$.

The curves of FIGS. 4 and 5 are obtained from the unbroadened gain g (that is, assuming strict k-selection), in a semiconductor, given by $$g = \frac{B_{12}}{Vg} p(E)(f_2 - f_1)$$

where
$B_{12}$ is the probability coefficient for absorptive transitions
Vg is the group velocity
p(e) is the density of states which equals $$\frac{Mr}{\pi\hbar^2 L_z}$$

In a quantum well laser structure $$f_2 - f_1 = \frac{1}{\left(1 + \exp\frac{(Mr/Mc \cdot (E - Eg) - Efc)}{kT}\right)} - \frac{1}{\left(1 + \exp\frac{(-Mr/Mv \cdot (E - Eg) - Efv)}{kT}\right)}$$

Substituting $$E = Eg + \frac{Mc}{Mr} Efc$$

to incorporate the condition that α=0, then $$gLz = \frac{B_{12}}{Vg} \cdot \frac{Mr}{\pi K^2} \cdot \frac{1}{2} \cdot \frac{(A - B)}{(A + B)}$$

where $A = (\exp \pi\hbar^2 PLz/kTMv) - 1$ and $B = (\exp \pi\hbar^2 NLz/kTMc - 1)^{Mc/Mv}$ and since P=N+Na, g can be expressed in terms of N and Na normalised to Lz, as shown in FIG. 4.

Although the laser structure 1 described above is a multiple QW structure, it is not necessary that such a structure be used. A bulk semiconductor structure might be used instead. In this case, the valence band quasi Fermi level is given by $$Efv = \text{approximately} -kT\left(\log\frac{(P)}{Nv} + 0.35\frac{(P)}{Nv}\right)$$

In order for Efv to be degenerate with respect to the valence band edge (that is, applying the approximation to the condition that $-Efv > McEfc/Mv$), then P must be at least equal to 0.77 Nv. For a bulk semiconductor structure comprising an active layer of $In_{0.6}Ga_{0.4}As_{0.88}P_{0.12}$ and confinement layers of InP, emitting radiation at a wavelength of 1.5 µm, then Nv equals $1.2 \times 10^{19}$ cm$^{-3}$. Since $P = (N + Na) =$ at least 0.77 Nv, that is $9.24 \times 10^{18}$ cm$^{-3}$, and for a reasonable injected carrier density $N = 1 \times 10^{18}$ cm$^{-3}$, then $Na =$ at least $8.24 \times 10^{18}$.

Figure 5A:
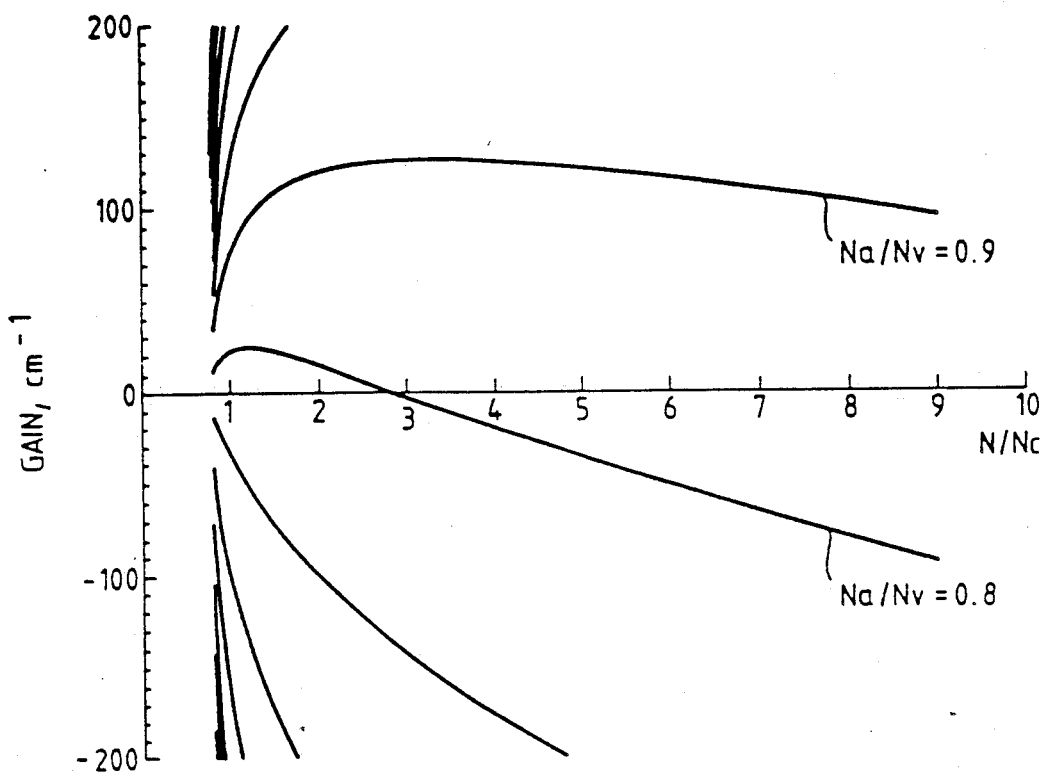
FIGS. 5a and 5b show the relationship between gain, N, Na and Efc for a bulk semiconductor structure.
Figure 5B:
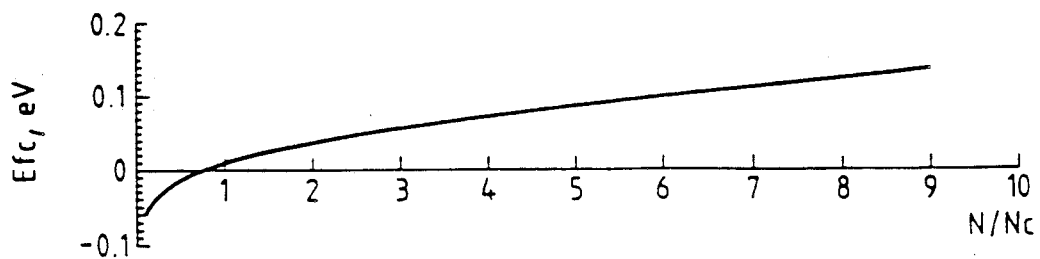

Referring to FIGS. 5a and 5b to plot gain and Efc for this bulk semiconductor structure, using Na as a parameter, so that Na can be selected to give reasonable gain at a particular value of Efc, then the following relationships can be considered, starting again from $$g = \frac{B_{12}}{Vg} p(E)(f_2 - f_1)$$

The density of states p(E) is given by $$p(E) = \frac{1}{2\pi^2}\frac{2Mr}{\hbar^2}^{3/2}(E - Eg)^{1/2}$$

and $(f_2 - f_1)$ can be expressed in terms of E, Eg, Efc and Efv as above.

To calculate the gain at the photon energy where $\alpha$ is zero, we substitute $$E = Eg + \frac{Mc}{Mr} Efc$$

which gives g in terms of N with Na as a parameter, as shown in FIG. 4.

It can be seen from FIGS. 5a and 5b that in order to achieve a gain of the order of 165 cm$^{-1}$ in this case, a doping level Na approaching Nv would have to be used. That is, Na would have to be about $1.2 \times 10^{19}$ cm$^{-3}$.

Figure 6:
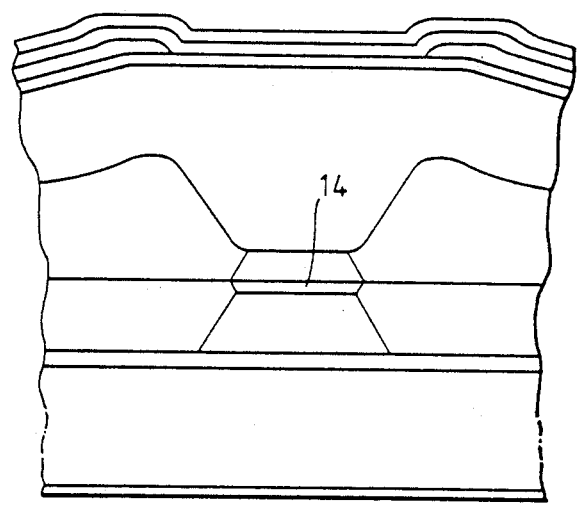
FIG. 6 shows schematically a cross section of an alternative laser structure to that of FIGS. 1a and 1b.

Referring to FIG. 6, a bulk semiconductor laser structure which might be used in an embodiment of the present invention comprises a laser of the buried heterostructure type having a p-doped active layer 14 of InGaAsP. However, laser structures of other types might be used instead.

Although the laser structures described above comprise particular materials containing In, Ga, As and P, other combinations of these elements, or even other material systems, may well be found suitable, for instance to achieve different values of Eg and different emitted photon energies.

Using the relationships described above to design laser structures may not give an exactly accurate result. For instance, an error of up to about 10°/o might be found in the value of Efc. However, to be useful, for instance in reducing transient wavelength chirping, it is likely that $\alpha$ will be required to have a value of less than or equal to 2, more preferably less than or equal to 1, and more preferably of less than or equal to 0.5. To check the value of $\alpha$, one can check the chirp to modulated power ratio, using the technique described by T L Koch and J E Bowers in Electronics Letters, December 1984, pp 1038 to 1040. In this technique, a small radio frequency signal is used to amplitude modulate the output of a laser. Any frequency modulation present is detected. Where no frequency modulation is present, $\alpha$ has the value 0.

We claim:

1. A direct band gap semiconductor laser structure having a resonant cavity and electrodes whose emission wavelength is less than its active material band gap equivalent wavelength by an amount such that the emitted photon energy is at least approximately equal to the sum of the band gap energy and the conduction band quasi Fermi level measured from the conduction band edge, the active material of the laser structure being doped p-type to a level at which the laser structure shows positive gain under working conditions.

2. A direct band gap semiconductor laser structure having a resonant cavity and electrodes having means for determining its emission wavelength, wherein the following relationships are satisfied:

(i) E is equal or approximately equal to $$Eg + \frac{Mc}{Mr} Efc$$

(ii) $-Efv > McEfc/Mv$ where
E is the emitted photon energy
Eg is the band gap energy
Mc is the conduction band electron effective mass
Mv is the valence band hole effective mass
Mr is the reduced mass given by the relationship $$1/Mr = 1/Mc + 1/Mv$$

Efc is the conduction band quasi Fermi level measured from the conduction band edge, and
Efv is the valence band quasi Fermi level measured from the valence band edge,
the material-dependent parameters of the above relating to the active material of the laser structure.

3. A laser structure according to claim 1 or 2 wherein the semiconductor laser structure comprises a quantum well active layer.

4. A laser structure according to claim 3 wherein the semiconductor laser structure comprises multiple quantum well active layers.

5. A laser structure according to claim 3 wherein the material of the active layer or layers is doped p-type to a level at least of the order of $4 \times 10^{18}$ cm$^{-3}$.

6. A laser structure according to either one of claims 1 or 2 wherein the semiconductor laser structure comprises a bulk semiconductor laser structure.

7. A laser structure according to claim 6 wherein the material of the active layer is doped p-type to a level at least of the order of $8 \times 10^{18}$ cm$^{-3}$.

8. A laser structure according to claim 1 or 2 wherein the active material of the laser structure comprises III-V semiconductor material.

9. A laser structure according to claim 8 wherein the active material of the laser structure comprises InGaAsP.

10. A laser structure according to claim 8 wherein the active material of the laser structure comprises InGaAs.

11. A laser structure according to claim 1 or 2 wherein the active material of the laser structure is doped p-type using the dopant berillium.

* * * * *